(12) United States Patent
Chen

(10) Patent No.: US 6,433,711 B1
(45) Date of Patent: Aug. 13, 2002

(54) SYSTEM AND METHOD FOR OFFSET ERROR COMPENSATION IN COMPARATORS

(75) Inventor: Feng Chen, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/711,349

(22) Filed: Nov. 9, 2000

Related U.S. Application Data

(60) Provisional application No. 60/170,859, filed on Dec. 14, 1999.

(51) Int. Cl.[7] ............................................. H03M 1/06
(52) U.S. Cl. ........................ 341/118; 341/172; 341/156
(58) Field of Search ................................ 341/118, 172, 341/155, 143, 128, 156, 161, 129, 120, 141

(56) References Cited

U.S. PATENT DOCUMENTS

| | | | |
|---|---|---|---|
| 5,703,589 A | * 12/1997 | Kalthoff et al. | 341/172 |
| 6,037,887 A | * 3/2000 | Wu et al. | 341/143 |
| 6,201,835 B1 | * 3/2001 | Wang | 375/247 |
| 6,204,787 B1 | * 3/2001 | Baird | 341/139 |
| 6,281,828 B1 | * 8/2001 | Kimura et al. | 341/155 |

* cited by examiner

Primary Examiner—Brian Young
Assistant Examiner—John Nguyen
(74) Attorney, Agent, or Firm—W. Daniel Swayze, Jr.; W. James Brady; Frederick J. Telecky, Jr.

(57) ABSTRACT

An offset error compensation system is provided that includes a comparator (42) having an offset error (44), a positive receptor (56), a negative receptor (58), a positive output (60), and a negative output (62). A sequence generator (14) generates control signals (22) representing normal cycles and swap cycles. A first cross connect (46) is coupled to the positive receptor (56), the negative receptor (58), a positive input signal (52), and a negative input signal (54). The first cross connect (46) couples the positive input signal (52) to the positive receptor (56) and the negative input signal (54) to the negative receptor (58) in response to a normal cycle. The first cross connect (46) further couples the positive input signal (52) to the negative receptor (58) and the negative input signal (54) to the positive receptor (56) in response to a swap cycle. A second cross connect (48) is coupled to the positive receptor (56), the negative receptor (58), the positive output (60), and the negative output (62). The second cross connect (48) couples the positive receptor (56) to the positive output (60) and the negative receptor (58) to the negative output (62) in response to the normal cycle. The second cross connect (48) further couples the positive receptor (56) to the negative output (62) and the negative receptor (58) to the positive output (60) in response the swap cycle.

11 Claims, 2 Drawing Sheets

SYSTEM AND METHOD FOR OFFSET ERROR COMPENSATION IN COMPARATORS

This application claims benefit of Prov. No. 60/170,859 filed Dec. 14, 1999.

TECHNICAL FIELD OF THE INVENTION

This invention relates in general to the field of integrated circuits and more particularly to an improved system and method for offset error compensation in comparators.

BACKGROUND OF THE INVENTION

Integrated circuits formed on a substrate such as a silicon wafer often have offset errors introduced during the wafer fabrication process. These offset errors result from slight dimensional differences in integrated circuit components such as transistors. For example, a comparator may have a positive and a negative input each consisting of a transistor. A slight dimensional difference between the two transistors introduces an offset error into the comparator. The offset error may result in incorrect output. In addition, offset errors degrade both the linearity and the noise performance of the analog-to-digital converter in which the comparator is used.

Conventional systems for handling offset errors in integrated circuits include a cancellation scheme where the offset error is sampled and stored on a capacitor. The stored offset error is then used to cancel the offset error in the comparator. However, this cancellation scheme uses an extra clock cycle and limits clock speed thereby reducing the throughput of the comparator.

Another conventional technique for handling offset errors is the use of a dithering technique. This dithering technique adds a random noise source to an analog input to randomize the offset error. Random noise is added as a dithering source to improve the spurious free dynamic range. The disadvantage of the dithering technique is the random noise used as a dithering source is difficult to control and degrades the signal-to-noise ratio of the comparator. Therefore, it is desirable to handle offset errors in a more efficient manner.

SUMMARY OF THE INVENTION

From the foregoing, it may be appreciated that a need has arisen for a system and method for offset error averaging in comparators that provides improved linearity and increased speed. In accordance with the present invention, a system and method for offset error averaging in comparators are provided that substantially eliminate and reduce disadvantages and problems associated with conventional offset error compensation techniques.

According to an embodiment of the present invention, an offset error averaging system is provided that includes a comparator having an offset error, a positive receptor, a negative receptor, a positive output, and a negative output. A sequence generator generates a sequence of positive swap cycles and negative swap cycles. A first cross connect is coupled to the positive receptor, the negative receptor, a positive input signal, and a negative input signal. The first cross connect couples the positive input signal to the positive receptor and the negative input signal to the negative receptor in response to a positive swap cycle. In addition, the first cross connect couples the positive input signal to the negative receptor and the negative input signal to the positive receptor in response to a negative swap cycle. A second cross connect is coupled to the positive receptor, the negative receptor, the positive output, and the negative output. The second cross connect couples the positive receptor to the positive output and the negative receptor to the negative output in response to a positive swap cycle. In addition, the second cross connect couples the positive receptor to the negative output and the negative receptor to the positive output in response to a negative swap cycle.

The present invention provides various technical advantages over conventional systems for offset error compensation. For example, one technical advantage is providing improved linearity for comparators. Another technical advantage is to provide increased processing speed for the comparator. Yet another technical advantage is to minimize noise introduced into the circuit. Still another technical advantage is to minimize hardware needed for implementation of offset error compensation. A further technical advantage is in providing programmable control of the control sequence. Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts and wherein.

DETAILED DESCRIPTION OF THE INVENTION

Figure 1:
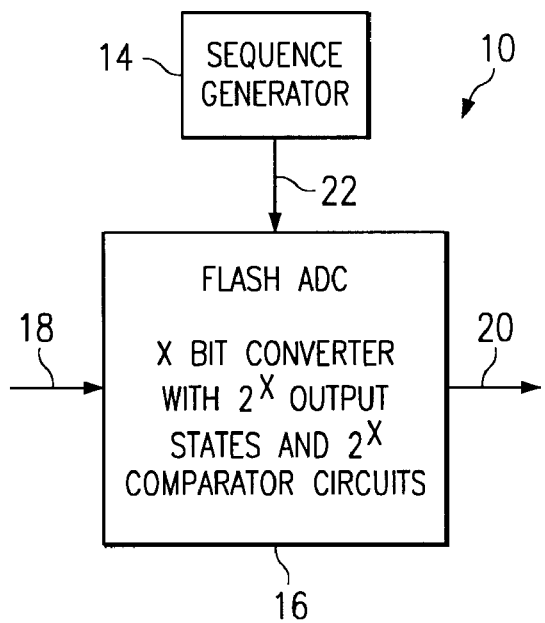
FIG. 1 illustrates an overview of an analog-to-digital converter system.

Referring to FIG. 1, an analog-to-digital converter (ADC) system is generally indicated at 10. ADC system 10 may be any suitable ADC system including a Flash ADC. A flash ADC may be characterized as an N-bit analog-to-digital converter with $2^n$ output states and $2^n-1$ parallel comparator circuits. For example, a 6-bit analog-to-digital converter would have 64 output states and 63 parallel comparator circuits. The use of parallel architecture increases processing speed.

ADC system 10 includes a sequence generator 14 and a flash ADC 16. Flash ADC 16 receives an analog input signal 18 and generates a digital output signal 20. Flash ADC 16 also receives control signals 22 generated by sequence generator 14. Sequence generator 14 provides control signals used by comparator circuits of the present invention to minimize the effect of offset errors present in the comparator circuits. The present invention also minimizes the amount of noise introduced into the input signals for flash ADC 16. In addition, the present invention minimizes processing related to offset error compensation and uses a single clock cycle to compensate for offset errors thereby increasing processing speed.

Offset errors are inherent in integrated circuit components such as comparators. The offset errors are introduced into integrated circuit components during fabrication. The present invention minimizes the effect of offset errors over a period of time by swapping the polarity of the offset error at specified intervals. Over the period of time, the effect of the offset error averages to near zero. By minimizing the effect of offset errors, the linearity of devices may be improved.

Figure 2:
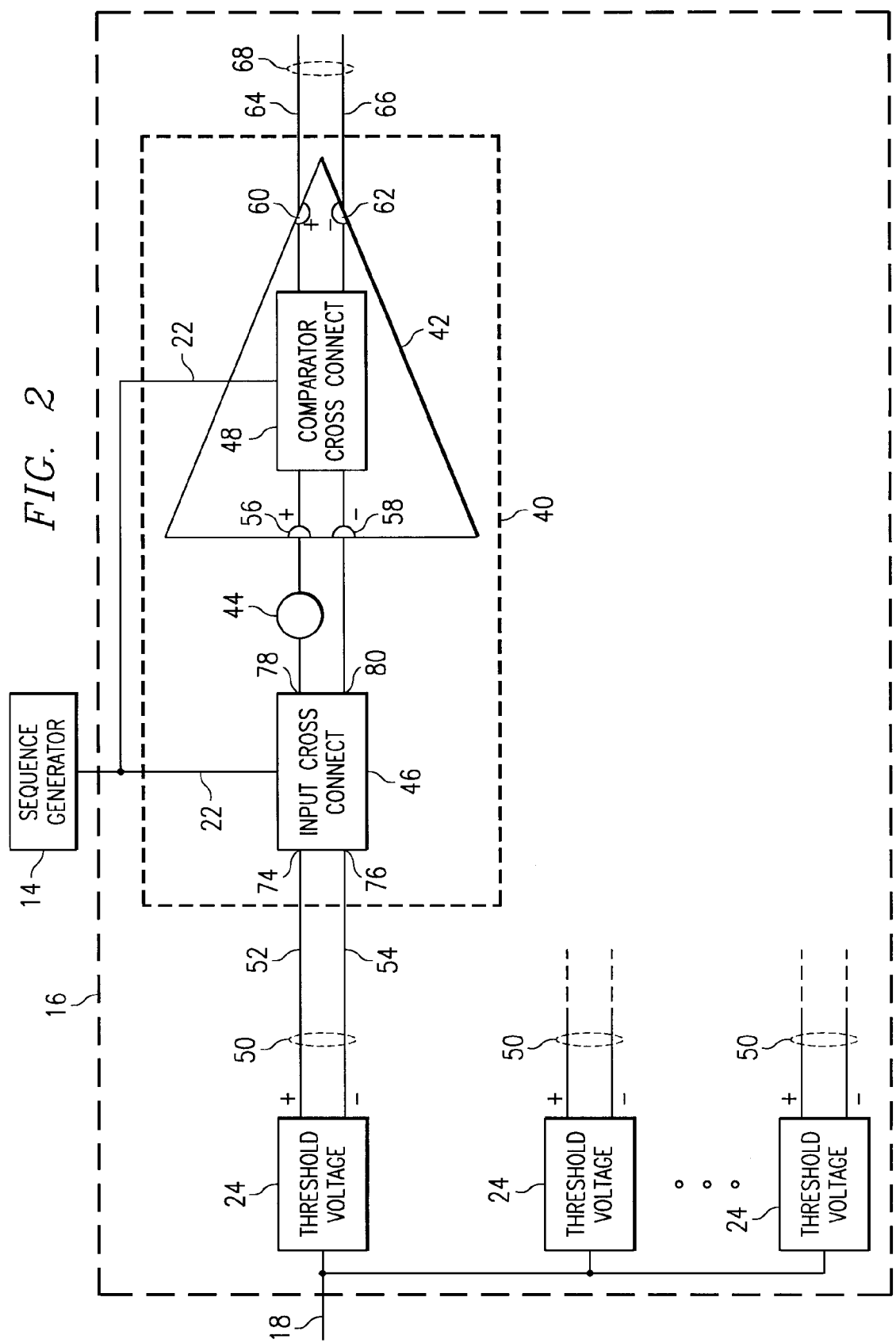
FIG. 2 illustrates an offset error compensating comparator.

Referring to FIG. 2, flash ADC 16 is illustrated with one or more offset error compensating comparators 40. Offset error compensating comparator 40 may be used in any suitable device including a single comparator device or a flash ADC with multiple parallel comparators. Offset error compensating comparator 40 includes a comparator 42 with an offset error 44. Although offset error 44 is part of comparator 42, it is illustrated here as a separate element for ease of illustration and discussion. Offset error 44 causes a change in an input voltage to comparator 42 and is often called an input referred offset. Offset error 44 may have a positive or negative effect on the input voltage and may occur in any part of comparator 42. Comparator 42 includes a positive receptor 56, a negative receptor 58, a positive output 60, and a negative output 62. Positive receptor 56 and negative receptor 58 receive the positive and negative components of an input signal. After processing, comparator 42 forwards the positive and negative component parts of the input signal to positive output 60 and negative output 62 as a digital output signal 68. Comparator 42 includes a comparator cross connect 48 with inputs of positive receptor 56 and negative receptor 58 and outputs of positive output 60 and negative output 62.

Analog input signal 18 has a threshold voltage 24 subtracted from it to provide a threshold corrected input signal 50 to the offset error compensating comparator 40. Each offset error compensating comparator 40 in flash ADC 16 has a corresponding threshold voltage 24. By subtracting the threshold voltage 24 from the analog input signal 18, each offset error compensating comparator 40 in flash ADC 16 may process a certain voltage range in analog input signal 18. Threshold corrected input signal 50 provides the input signal for comparator 42 and includes component parts of a positive input signal 52 and a negative input signal 54. A two-line input cross connect 46 includes a first input 74, a second input 76, a first output 78, and a second output 80. Positive input signal 52 is coupled to first input 74 and negative input signal 54 is coupled to second input 76. First output 78 is coupled to positive receptor 56 and second output 80 is coupled to negative receptor 58. Input cross connect 46 may be a separate device for preprocessing threshold corrected input signal 50 or an integral part of comparator 42.

Offset error compensating comparator 40 also includes sequence generator 14 for generating control signals 22. Control signals 22 are coupled to input cross connect 46 and comparator cross connect 48 and provide control signals for the cross connect functionality of input cross connect 46 and comparator cross connect 48.

The present invention minimizes the effect of offset error 44 by swapping the polarity of threshold corrected input signal 50 at certain time intervals. The polarity of threshold corrected input signal 50 is swapped by input cross connect 46 forwarding positive input signal 52 to second output 80 which is coupled to negative receptor 58 and by forwarding negative input signal 54 to first output 78 which is coupled to positive receptor 56. Cross connecting the input signals effectively swaps the polarity of offset error 44. Comparator cross connect 48 swaps the polarity of the input signals received by comparator 42 by forwarding the input signal received by positive receptor 56 to negative output 62 and by forwarding the input signal received by negative receptor 58 to positive output 60. The use of two cross connects insures that positive input signal 52 is processed and provided to positive output 60 and that negative input signal 54 is processed and provided to negative output 62 regardless of the signal path through offset error compensating comparator 40.

Input cross connect 46 has two states. The first state is a normal state where the input signal received at first input 74 is forwarded directly to first output 78 and the input signal received at second input 76 is forwarded directly to second output 80. The second state is a swap state where the input signal received at first input 74 is cross connected and forwarded to second output 80 and the input signal received at second input 76 is cross connected and forwarded to first output 78. By cross connecting the input signals, first cross connect 46 effectively swaps the polarity of the input signals.

Comparator cross connect 48 is similar in structure and operation to input cross connect 46 and has two states, a normal state and a swap state. In the normal state, comparator cross connect 48 forwards the input signal received at positive receptor 56 to positive output 60 and the input signal received at negative receptor 58 to negative output 62. In the swap state, comparator cross connect 48 cross connects and forwards the input signal received at positive receptor 56 to negative output 62 and cross connects and forwards the input signal received at negative receptor 58 to positive output 60. By cross connecting the positive and negative signals within comparator 42 prior to output, comparator cross connect 48 insures that the signal corresponding to positive input signal 52 is forwarded to positive output 60 regardless of the state of both input cross connect 46 and comparator cross connect 48. Input cross connect 46 and comparator cross connect 48 should be in the same state at any given point in time.

Sequence generator 14 generates control signals 22 for controlling the state of input cross connect 46 and comparator cross connect 48. Sequence generator 14 provides the same control signals 22 to both input cross connect 46 and comparator cross connect 48. Thus, input cross connect 46 and comparator cross connect 48 have the same state at any point in time. When offset error compensating comparator 40 is used in flash ADC 16, sequence generator 14 may provide the same control signals 22 to all offset error compensating comparators 40 in flash ADC 16. In another embodiment, each offset error compensating comparator 40 in flash ADC may have unique control signals 22 generated by a single sequence generator 14.

Control signals 22 include a control signal for each operational state of input cross connect 46 and second cross connect 48. The two control signals are normal cycle and swap cycle that correspond to the normal state and the swap state of input cross connect 46 and comparator cross connect 48.

Over any period of time, the ratio of normal cycles to swap cycles generated by sequence generator 14 should be approximately one-to-one. This one-to-one ratio minimizes the effect of offset error 44 by having offset error 44 equally affect positive input signal 52 and negative input signal 54 over the period of time. Any suitable sequence of control signals may be used provided that over a specified period of time the ratio of normal cycles to swap cycles is approximately one-to-one. The period of time is chosen such that the linearity and other factors affecting the performance of offset error compensating comparator 40 are optimized.

Sequence generator 14 may generate a sequence of control signals 22 using any suitable sequence of normal cycles and swap cycles. In one embodiment, sequence generator 14 generates control signals 22 that alternate between normal cycle and swap cycle with every other clock signal. Inherent in this sequence generation is a ratio of one normal cycle to one swap cycle over any period of time.

In another embodiment, digital output signal 68 is used to determine the next control signal (either normal cycle or swap cycle) in control signals 22. Sequence generator 14 may provide unique control signals 22 to each offset error compensating comparator 40 in flash ADC 16. A certain digital output signal 68 is generated for an analog input signal 18 that falls within a specified voltage range. This voltage range has an upper bound and lower bound. The upper and lower bounds are represented by two threshold voltages 24. Sequence generator 14 uses digital output signal 68 to determine which two threshold voltages 24 define the upper and lower bounds of the voltage range represented by digital output signal 68. Sequence generator 14 then generates control signals 22 that change the cross connect state of the offset error compensating comparators 40 that process the threshold voltages 24 corresponding to the upper bound and the lower bound of the voltage range. The other offset error compensating comparators 40 in flash ADC 16 remain unchanged. The cross connect state is changed from normal cycle to swap cycle or swap cycle to normal cycle. In this embodiment, only those comparators processing signals close to the previous threshold corrected input signal 50 have their cross connect state changed.

In another embodiment, a sigma delta modulator code dependent scheme (with no input to the modulator) is used in sequence generator 14 to generate control signals 22. The sigma delta modulator code dependent scheme has noise-shaping characteristics and a ratio of normal states to swap states of approximately one-to-one over a certain period of time.

In another embodiment, a random swapping scheme is used by sequence generator 14 to generate control signals 22. In that embodiment, a random generator is used to randomly generate a control signal 22 sequence of normal cycles and swap cycles with a ratio of approximately one-to-one over a certain period of time. The period of time is chosen such that the effect of offset error 44 is minimized. All offset error compensating comparators 40 in flash ADC 16 may simultaneously have their cross connect states determined, or unique control signals 22 may be provided to each offset error compensating comparator 40 in flash ADC 16 such that the cross connect states of each offset error compensating comparator 40 are randomly swapped.

In each of the aforementioned control signal sequences, the ratio of normal cycles to swap cycles over a period of time is approximately one-to-one such that offset error 44 equally affects positive input signal 52 and negative input signal 54.

Figure 3:
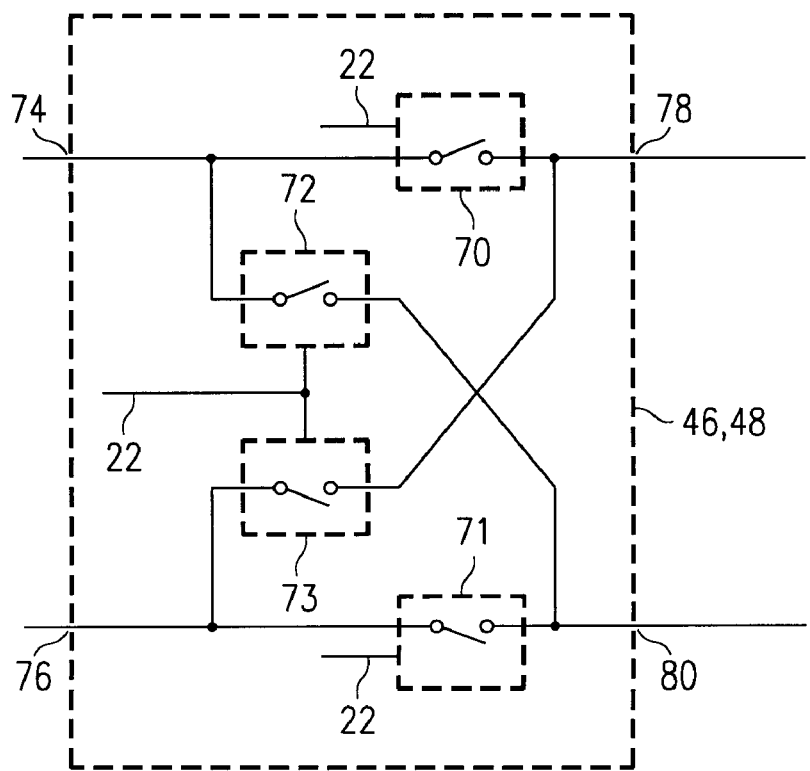
FIG. 3 illustrates a cross connect used in the offset error compensating comparator.

Referring to FIG. 3, the internal details of input cross connect 46 and comparator cross connect 48 are illustrated. Input cross connect 46 and comparator cross connect 48 operate in the same manner using the same control signals 22. FIG. 3 will be discussed in terms of input cross connect 46 but applies equally to comparator cross connect 48. Input cross connect 46 includes a first input 74 coupled to a first normal switch 70 that is then coupled to first output 78. A second input 76 is coupled to a second normal switch 71 that is then coupled to second output 80. First input 74 is also coupled to a first swap switch 72 that is then coupled to second output 80. Second input 76 is also coupled to a second swap switch 73 that is then coupled to first output 78. This configuration provides two signal paths for an input signal received at first input 74. That input signal can proceed to first output 78 through first normal switch 70 or to second output 80 through first swap switch 72. In the same way, an input signal received at second input 76 may proceed to second output 80 through a second normal switch 71 or to first output 78 through a second swap switch 73. Thus, input cross connect 46 includes two normal switches 70 and 71 and two swap switches 72 and 73.

The normal cycle and swap cycle of control signals 22 control the operation of first normal switch 70, second normal switch 71, first swap switch 72, and second swap switch 73. When input cross connect 46 receives a normal cycle control signal 22, first normal switch 70 and second normal switch 71 close and first swap switch 72 and second swap switch 73 open thereby causing input signals to flow directly through input cross connect 46. Input signals received at first input 74 are forwarded to first output 78 through first normal switch 70 and input signals received at second input 76 are forwarded to second output 80 through second normal switch 71. When input cross connect 46 receives a swap cycle control signal 22, first normal switch 70 and second normal switch 71 open and first swap switch 72 and second swap switch 73 close thereby causing the input signals to be cross connected and flow to opposite outputs. An input signal received at first input 74 is forwarded to second output 80 through first swap switch 72 and an input signal received at second input 76 is forwarded to first output 78 through second swap switch 73.

Thus, it is apparent that there has been provided in accordance with the present invention, a system and method for offset error averaging in comparators that satisfies the advantages set forth above including improved linearity and increased processing speed. Although the present invention and its advantages have been described in detail, it should be understood that various changes, substitutions, and alterations may be readily apparent to those skilled in the art and may be made herein without departing from the spirit and the scope of the present invention as defined by the following claims.

What is claimed is:

1. An analog to digital converter, comprising:
   a comparator having an offset error, a positive receptor, a negative receptor, a positive output, and a negative output;
   a sequence generator operable to generate a control signal representing either a normal cycle or a swap cycle;
   a first cross connect coupled to the positive receptor, the negative receptor, a positive input signal, and a negative input signal, the first cross connect operable to couple the positive input signal to the positive receptor and the negative input signal to the negative receptor in response to a normal cycle control signal from the sequence generator, the first cross connect further operable to couple the positive input signal to the negative receptor and the negative input signal to the positive receptor in response to a swap cycle control signal from the sequence generator; and
   a second cross connect coupled to the positive receptor, the negative receptor, the positive output, and the negative output, the second cross connect operable to couple the positive receptor to the positive output and the negative receptor to the negative output in response to the normal cycle control signal, the second cross connect further operable to couple the positive receptor to the negative output and the negative receptor to the positive output in response to the swap cycle control signal.

2. The converter of claim 1, wherein the first cross connect is an integral part of the comparator.

3. The converter of claim 1, wherein the second cross connect is an integral part of the comparator.

4. The converter of claim 1, wherein the sequence generator generates an approximately equal number of normal cycle and swap cycle control signals over a period of time.

5. The converter of claim 1, wherein the sequence generator alternates between the normal cycle and the swap cycle for every other control signal.

6. The converter of claim 1, wherein the sequence generator determines a next control signal in response to a comparator output.

7. The converter of claim 1, wherein the sequence generator uses a sigma delta modulator to determine the normal cycle or the swap cycle representation for the control signal.

8. The converter of claim 1, wherein the sequence generator randomizes the control signal representation of the normal cycle and the swap cycle.

9. The converter of claim 1, wherein the positive input signal and the negative input signal comprise a combined input signal.

10. The converter of claim 9, wherein the combined input signal is threshold corrected by removing a threshold voltage from the combined input signal.

11. An analog-to-digital convertor, comprising:

a plurality of comparators, each comparator having an offset error, a positive receptor, a negative receptor, a positive output, and a negative output;

a sequence generator operable to generate a control signal representing either a normal cycle or a swap cycle;

a plurality of first cross connects, each first cross connect coupled to the positive receptor and the negative receptor of one of the plurality of comparators, each first cross connect further coupled to a positive input signal and a negative input signal, each first cross connect operable to couple the positive input signal to the associated positive receptor and the negative input signal to the associated negative receptor in response to a normal cycle control signal generated by the sequence generator, each first cross connect further operable to couple the positive input signal to the associated negative receptor and the negative input signal to the associated positive receptor in response to a swap cycle control signal generated by the sequence generator; and a plurality of second cross connects, each second cross connect coupled to the positive receptor, the negative receptor, the positive output, and the negative output of one of the plurality of comparators, each second cross connect operable to couple the positive receptor to the positive output and the negative receptor to the negative output in response to the normal cycle control signal, each second cross connect further operable to couple the positive receptor to the negative output and the negative receptor to the positive output in response to the swap cycle control signal.

* * * * *